US008852346B2

(12) United States Patent
Lee

(10) Patent No.: US 8,852,346 B2
(45) Date of Patent: Oct. 7, 2014

(54) MASK FRAME ASSEMBLY FOR THIN LAYER DEPOSITION AND ORGANIC LIGHT EMITTING DISPLAY DEVICE

(75) Inventor: Sang-Shin Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 601 days.

(21) Appl. No.: 12/973,597

(22) Filed: Dec. 20, 2010

(65) Prior Publication Data
US 2011/0157575 A1 Jun. 30, 2011

(30) Foreign Application Priority Data

Dec. 25, 2009 (KR) .................. 10-2009-0125023

(51) Int. Cl.
| | | |
|---|---|---|
| C23C 16/50 | (2006.01) | |
| C23C 16/00 | (2006.01) | |
| C23F 1/00 | (2006.01) | |
| H01L 21/306 | (2006.01) | |
| C23C 14/04 | (2006.01) | |
| H01L 51/00 | (2006.01) | |
| H01L 27/32 | (2006.01) | |
| H01L 51/56 | (2006.01) | |

(52) U.S. Cl.
CPC .......... H01L 51/0011 (2013.01); C23C 14/042 (2013.01); H01L 51/56 (2013.01); H01L 27/3211 (2013.01)
USPC ........................................ 118/720; 156/345.3

(58) Field of Classification Search
USPC .................. 118/720, 721; 156/345.1, 345.11, 156/345.19, 345.3; 216/41–51
See application file for complete search history.

(56) References Cited

U.S. PATENT DOCUMENTS

| | | | |
|---|---|---|---|
| 2001/0004186 A1* | 6/2001 | Song et al. .................... | 313/407 |
| 2003/0011299 A1 | 1/2003 | Kim | |
| 2003/0221613 A1* | 12/2003 | Kang et al. .................... | 118/504 |

(Continued)

FOREIGN PATENT DOCUMENTS

| | | |
|---|---|---|
| KR | 10-2003-0002947 A | 1/2003 |
| KR | 10-2003-0056817 A | 7/2003 |
| KR | 10-2003-0093959 A | 12/2003 |
| KR | 10-2005-0083422 A | 8/2005 |
| KR | 10-2006-0055097 A | 5/2006 |

(Continued)

OTHER PUBLICATIONS

Korean Office Action dated Nov. 22, 2011 for Korean Patent Application No. KR 10-2009-0125023 which corresponds to captioned U.S. Appl. No. 12/973,597.

Primary Examiner — Maureen Gramaglia
Assistant Examiner — Tiffany Nuckols
(74) Attorney, Agent, or Firm — Knobbe, Martens, Olson & Bear, LLP

(57) ABSTRACT

A mask frame assembly for thin film deposition is disclosed. In one embodiment, the assembly includes: a frame, and a plurality of unit mask strips attached to the frame, wherein each of the unit mask strips includes a plurality of unit masking patterns which are spaced apart from each other. In one embodiment, each of the unit masking patterns includes: i) a plurality of stripe pattern slits and ii) a plurality of sets of dot pattern slits each set formed to be substantially parallel with the stripe pattern slits. Further, the stripe pattern slits and the sets of dot pattern slits are alternately formed with respect to each other, wherein each set of the dot pattern slits includes a plurality of dot pattern slits, and wherein the length of each stripe pattern slit is substantially the same as the length of each set of the dot pattern slits.

8 Claims, 8 Drawing Sheets

(56) References Cited

U.S. PATENT DOCUMENTS

2003/0221614 A1   12/2003   Kang et al.
2004/0104197 A1*   6/2004   Shigemura et al. ............. 216/20
2009/0137180 A1   5/2009   Sung et al.

FOREIGN PATENT DOCUMENTS

| | | |
|---|---|---|
| KR | 10-0603398 B1 | 7/2006 |
| KR | 10-2009-0021094 A | 2/2009 |
| KR | 10-2009-0053418 A | 5/2009 |

* cited by examiner

MASK FRAME ASSEMBLY FOR THIN LAYER DEPOSITION AND ORGANIC LIGHT EMITTING DISPLAY DEVICE

CROSS-REFERENCE TO RELATED PATENT APPLICATION

This application claims the benefit of Korean Patent Application No. 10-2009-0125023, filed on Dec. 25, 2009, in the Korean Intellectual Property Office, the disclosure of which is incorporated herein in its entirety by reference.

BACKGROUND

1. Field

The disclosed technology generally relates to a mask frame assembly for thin film deposition and an organic light emitting display device, and more particularly, to a mask frame assembly for thin film deposition that reduces deformation of a mask pattern and an organic light emitting display device manufactured by using the mask frame assembly.

2. Description of the Related Technology

Organic light emitting displays are self-emissive, and have wide viewing angles, excellent contrast, and fast response rates. Thus, they have been considered as a next generation display.

SUMMARY OF CERTAIN INVENTIVE ASPECTS

One aspect is a mask frame assembly for thin film deposition that includes a plurality of unit mask strips and reduces errors in positions of a plurality of unit masking pattern portions included in each unit mask strip, and an organic light emitting display device using the mask frame assembly.

Another aspect is a mask frame assembly for thin film deposition including a plurality of unit mask strips having both end portions extended in a lengthwise direction and fixed to a frame including an opening portion, wherein each of the plurality of unit mask strips comprises a plurality of unit masking pattern portions disposed in the lengthwise direction, wherein the plurality of unit masking pattern portions comprises: a plurality of stripe pattern opening portions disposed in parallel with the lengthwise direction and a plurality of dot pattern opening portions continuously disposed in the lengthwise direction between the plurality of stripe pattern opening portions.

The plurality of stripe pattern opening portions and the plurality of dot pattern opening portions may be disposed symmetrically to each other with respect to a central axis of the plurality of unit masking pattern portions in the lengthwise direction.

The plurality of stripe pattern opening portions may be disposed in both end portions of the plurality of unit masking pattern portions in the lengthwise direction. At least one of the plurality of dot pattern opening portions continuously disposed in the lengthwise direction may be disposed between the plurality of stripe pattern opening portions.

The plurality of dot pattern opening portions are divided by a plurality of blocking bridges disposed perpendicularly to the lengthwise direction and a space between the plurality of blocking bridges remains constant. The plurality of dot pattern opening portions continuously disposed in the lengthwise direction may be disposed in both end portions of the plurality of unit masking pattern portions in the lengthwise direction.

At least one of the plurality of stripe pattern opening portions may be disposed between the plurality of dot pattern opening portions continuously disposed in the lengthwise direction. The plurality of dot pattern opening portions may be divided by a plurality of blocking bridges disposed perpendicularly to the lengthwise direction and a space between the plurality of blocking bridges remains constant.

The plurality of unit mask stripes may have a tension. The plurality of unit mask stripes may be formed of nickel or a nickel alloy. Each of the plurality of unit mask stripes may further include a blocking portion for surrounding the plurality of unit masking pattern portions. The plurality of unit mask stripes may be fixed to the frame using welding. The plurality of unit mask stripes may be fixed to the frame using laser welding.

Another aspect is an organic light emitting display device comprising a first electrode and a second electrode that face each other and an intermediate layer comprising at least an organic light emitting layer disposed between the first electrode and the second electrode, wherein the intermediate layer comprises a plurality of stripe patterns continuously disposed in parallel with a first direction and a plurality of dot patterns disposed between the plurality of stripe patterns and continuously disposed in parallel with the first direction.

Both end portions of the organic light emitting display device may include the plurality of stripe patterns continuously disposed in parallel with the first direction. Both end portions of the organic light emitting display device may include the plurality of dot patterns continuously disposed in parallel with the first direction.

The organic light emitting layer may include a unit pixel as three sub-pixels comprising red, green, and blue light emitting layers, and the plurality of stripe patterns and the plurality of dot patterns are disposed in at least one unit pixels. One of the plurality of dot patterns may correspond to one of the three sub-pixels.

One of the plurality of dot patterns may correspond to a plurality of sub-pixels disposed in a first direction. A space between a plurality of blocking bridges disposed between the plurality of dot patterns that are adjacent to each other in the lengthwise direction may remain constant.

Another aspect is a mask frame assembly for thin film deposition comprising: a frame, wherein an opening is defined in the frame; and a plurality of unit mask strips which extend in a first direction to be substantially parallel with each other and attached to the frame such that the unit mask strips cross the opening of the frame, wherein each of the unit mask strips comprises a plurality of unit masking patterns which are spaced apart from each other and extend in a second direction substantially perpendicular to the first direction, wherein each of the unit masking patterns comprises: i) a plurality of stripe pattern slits each of which extends in the second direction and ii) a plurality of sets of dot pattern slits each set formed to be substantially parallel with the stripe pattern slits, wherein the stripe pattern slits and the sets of dot pattern slits are alternately formed with respect to each other, wherein each set of the dot pattern slits comprises a plurality of dot pattern slits, and wherein the length of each stripe pattern slit is substantially the same as the length of each set of the dot pattern slits.

In the above assembly, the stripe pattern slits and the sets of dot pattern slits are formed to be substantially symmetrical to each other with respect to a central axis of the unit masking patterns, and wherein the central axis is substantially parallel with the second direction.

In the above assembly, at least one of the stripe pattern slits is disposed in both ends of the unit masking patterns. In the above assembly, the dot pattern slits of each set are substantially evenly spaced apart from each other, and wherein at least one set of the dot pattern slits is disposed between the adjacent stripe pattern slits.

In the above assembly, two sets of the dot pattern slits are disposed between the adjacent stripe pattern slits. In the above assembly, the dot pattern slits of each set are divided by a plurality of blocking bridges, and wherein the blocking bridges have substantially the same length.

In the above assembly, at least one set of the dot pattern slits is disposed in both end portions of the unit masking patterns. In the above assembly, at least two of the stripe pattern slits are disposed between the adjacent sets of the dot pattern slits. In the above assembly, the unit mask stripes are formed of nickel or a nickel alloy. In the above assembly, each of the unit mask stripes further comprises a blocking portion which surrounds the unit masking patterns.

Another aspect is an organic light emitting display device comprising: a first electrode and a second electrode that face each other; and an intermediate layer comprising at least an organic light emitting layer disposed between the first electrode and the second electrode, wherein a plurality of stripe patterns and a plurality of sets of dot patterns are formed in the intermediate layer, wherein each set of the dot patterns is formed to be substantially parallel with the stripe patterns, wherein the stripe patterns and the sets of dot patterns are alternately formed with respect to each other, wherein each set of the dot patterns comprises a plurality of dot patterns, and wherein the length of each stripe patterns is substantially the same as the length of each set of the dot patterns.

In the above device, at least one of the stripe patterns is formed in both end portions of the organic light emitting display device. In the above device, at least one set of the dot patterns is formed in both end portions of the organic light emitting display device. In the above device, the organic light emitting layer comprises red, green, and blue light emitting layers, wherein the organic light emitting layer corresponds to a unit pixel, and wherein the red, green, and blue light emitting layers correspond to three sub-pixels, respectively, and wherein the stripe patterns and the sets of dot patterns correspond to at least one unit pixel.

In the above device, at least one set of the dot patterns corresponds to one of the three sub-pixels. In the above device, at least one set of the dot patterns corresponds to a plurality of sub-pixels. In the above device, the dot patterns of each set are substantially evenly spaced apart from each other. A mask frame assembly for thin film deposition comprising: a mask frame, wherein an opening is defined in the mask frame; and a plurality of unit mask strips which extend in a first direction to be substantially parallel with each other and cross the opening of the mask frame, wherein each of the unit mask strips comprises a plurality of unit masking patterns which are spaced apart from each other and extend in a second direction substantially perpendicular to the first direction, wherein each of the unit masking patterns comprises: i) a plurality of stripe pattern slits each of which extends in the second direction and ii) a plurality of sets of dot pattern slits each set formed to be substantially parallel with the stripe pattern slits, wherein the stripe pattern slits and the sets of dot pattern slits are alternately formed with respect to each other, wherein each set of the dot pattern slits comprises a plurality of dot pattern slits, wherein the length of each stripe pattern slit is substantially the same as the length of each set of the dot pattern slits, and wherein all of the unit masking patterns have substantially the same slit arrangement.

In the above device, the stripe pattern slits and the sets of dot pattern slits are formed to be substantially symmetrical to each other with respect to a central axis of the unit masking patterns, and wherein the central axis is substantially parallel with the second direction. In the above device, at least one of the stripe pattern slits is disposed in both ends of the unit masking patterns.

DETAILED DESCRIPTION OF CERTAIN INVENTIVE EMBODIMENTS

Organic light emitting displays include i) first and second electrodes that face each other and ii) an intermediate layer which is interposed between the electrodes and includes at least a light emitting layer. The intermediate layer and the electrodes may be formed using a variety of methods one of which is a deposition method. In order to manufacture an organic light emitting display using the deposition method, a mask having the same pattern as a thin film to be formed is adhered onto a surface on which the thin film is to be formed. The thin film is deposited on the mask, and thus the thin film having a predetermined pattern is formed.

When a mask is used to manufacture an organic light emitting display, a deposition process is performed after the mask is adhered to a substrate. A center portion of a typical mask does not adhere to the substrate due to the self-weight of the mask. Such a problem deteriorates as sizes of organic light emitting displays increase.

Hereinafter, embodiments will be described more fully with reference to the accompanying drawings, in which exemplary embodiments are shown.

Figure 1:
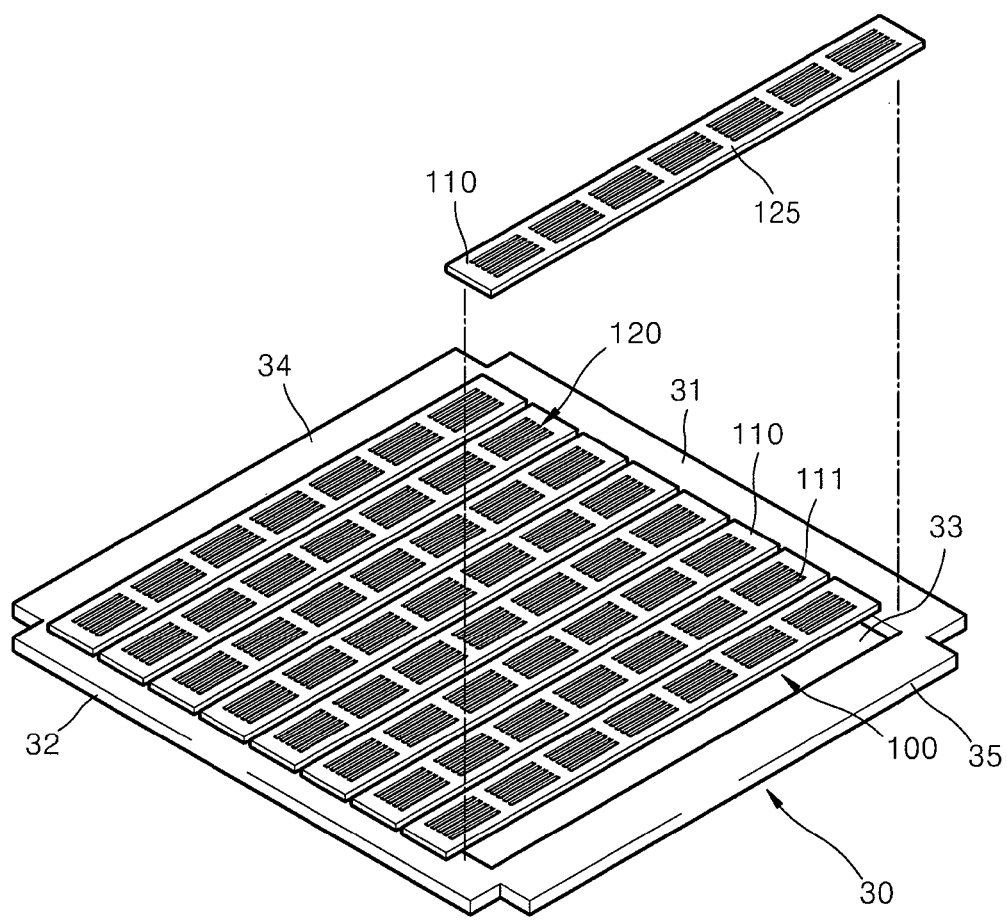
FIG. 1 is a schematic perspective view illustrating a mask frame assembly for thin film deposition, according to an embodiment.
Figure 1:
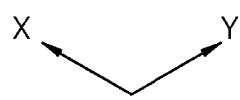

FIG. 1 is an exploded perspective view of a mask frame assembly for thin film deposition.

Referring to FIG. 1, the mask frame assembly for thin film deposition includes a frame 30 and a plurality of unit mask strips 110 wherein both end portions thereof are supported on the frame 30. A mask 100 includes the unit mask strips 110. The frame 30 includes first support portions 31 and 32 that are installed in substantially parallel with each other and second support portions 34 and 35 that are connected to end portions of the first support portions 31 and 32. In one embodiment, a substantially rectangular opening portion 33 is formed in the frame 30. In another embodiment, the shape of the opening portion 33 may be non-rectangular, for example, circular or other polygonal type. The second support portions 34 and 35 are installed in substantially parallel with the unit mask strips 110 and may be formed of an elastic material. However, the present invention is not limited thereto and the first support portions 31 and 32 and the second support portions 34 and 35 may be integrally formed with each other.

The unit mask strips 110, to which a tensile force is applied, are supported by the frame 30 and thus the frame 30 is desirable to have a sufficient hardness. Furthermore, the frame 30 may have any structures in which interference does not occur when the mask 100 is adhered to an object to be deposited.

The mask 100 includes the at least two unit mask strips 110. The mask 100 is separated into a plurality of unit mask strips 110 and is fixed to the frame 30, thereby preventing the mask 100 from sagging due to the self-weight of the mask 100. Meanwhile, although the mask 100 includes 9 unit mask strips 110 in the present embodiment, this is just exemplary and the present invention is not limited thereto.

In one embodiment, each of the unit mask strips 110 includes a substantially rectangular thin plate, a plurality of unit masking pattern portions 120 including a plurality of patterns for deposition 111 at predetermined intervals in a lengthwise direction (in a direction of $\pm y$), and a blocking portion 125 around the unit masking pattern portions 120.

The unit mask strips 110 may be formed of a magnetic thin plate, nickel or a nickel alloy, or a nickel-cobalt alloy having convenient fine patterning and excellent surface roughness. The patterns for deposition 111 included in each of the unit mask strips 110 may achieve fine patterning and excellent surface smoothness using an electro forming method. The unit mask strips 110 may be manufactured using an etching method. The unit mask strips 110 may be manufactured by forming a photoresist layer having substantially the same pattern as the patterns for deposition 111 on a thin plate using a photoresist or attaching a film having substantially the same pattern as the patterns for deposition 111 on the thin plate and etching the thin plate.

Both ends of each of the unit mask strips 110 to which a predetermined tensile force is applied in a lengthwise direction (a direction of $\pm y$) are fixed to the frame 30. The unit mask strips 110 are positioned to cross the opening portion 33. Further, all the patterns for deposition 111 of the unit mask strips 110 are disposed inside or directly above the opening portion 33 of the frame 30.

Although a variety of methods, such as laser welding, resistance thermal welding, etc., may be used to fix the unit mask strips 110 to the frame 30, laser welding may be used in terms of a change in precision, etc. In this embodiment, the unit mask strips 110 may be arranged by a predetermined gap and be fixed to the frame 30 by using laser welding.

Usage of the mask 100 that is divided into the unit mask strips 110 can prevent the mask 100 from sagging due to the self-weight of the mask 100 as described above. However, when an integral type mask is fixed to a frame, since the integral type mask is extended in the all directions (of $\pm x$ and $\pm y$) and is fixed to the frame, the integral type mask is not greatly deformed due to an asymmetry in an extension direction. In contrast, when the unit mask strips 110 are fixed to the frame 30, since both ends of each of the unit mask strips 110 are extended in the lengthwise direction (the direction of $\pm y$) of the unit mask strips 110 and are fixed to the frame 30, stress is generated in a direction (a direction of $\pm x$) substantially perpendicular to the extension direction. Such stress may cause deformation in the positions or shapes of the deposition patterns 111.

Figure 2:
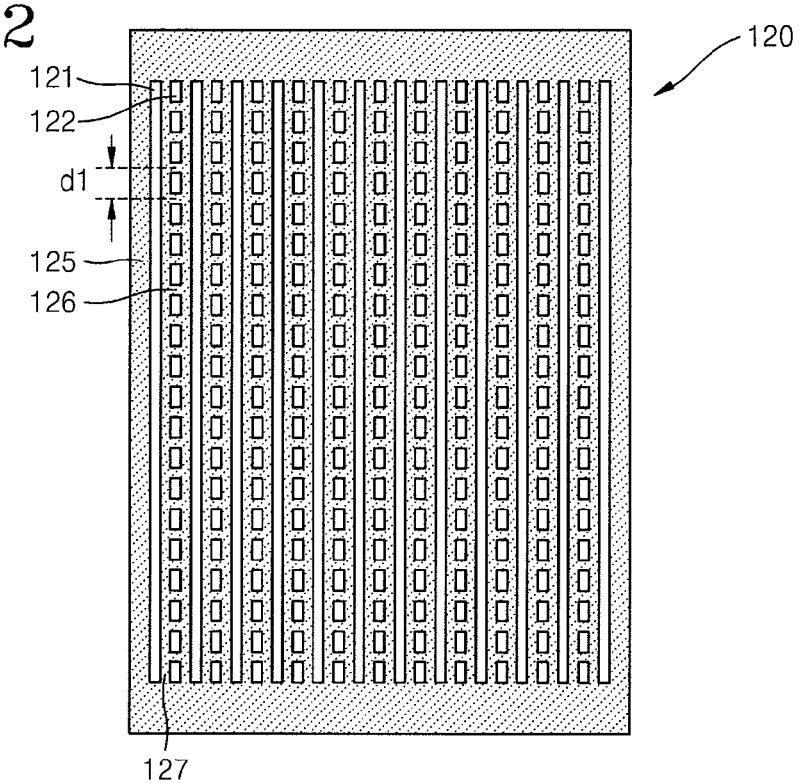
FIG. 2 is a schematic top view illustrating a unit masking pattern portion included in a mask frame assembly for thin film deposition, according to an embodiment.

FIG. 2 is a schematic top view illustrating the unit masking pattern portion 120 included in the mask frame assembly for thin film deposition, according to an embodiment.

Referring to FIG. 2, the unit masking pattern portion 120 according to the present embodiment includes a plurality of stripe pattern opening portions 121 and a plurality of dot pattern opening portions 122. The stripe pattern opening portions 121 are disposed in substantially parallel with the lengthwise direction (the direction of $\pm y$) of the unit mask strips 110. The dot pattern opening portions 122 are continuously disposed in the lengthwise direction (the direction of $\pm y$) between the stripe pattern opening portions 121. The stripe pattern opening portions 121 and dot pattern opening portions 122 are interchangeably used as stripe pattern slits and dot pattern slits (or sets of dot pattern slits). This applies to the remaining embodiments. The blocking portion 125 is disposed around the unit masking pattern portion 120.

The stripe pattern opening portions 121 and the dot pattern opening portions 122 are disposed substantially symmetrically to each other with respect to a central axis of the unit masking pattern portion 120.

The stripe pattern opening portions 121 are disposed in both ends of the unit masking pattern portion 120 in the lengthwise direction (the direction of $\pm y$). The dot pattern portions 122 are alternately disposed between the stripe pattern opening portions 121.

The dot pattern opening portions 122 that are adjacent to each other in the lengthwise direction (the direction of $\pm y$) are divided by a plurality of blocking bridges 126 that are disposed substantially perpendicularly to the lengthwise direction (the direction of $\pm y$). A space dl between the blocking bridges 126 remains substantially constant. In one embodiment, the space dl between the blocking bridges 126 is related to sizes of the dot pattern opening portions 122 in the lengthwise direction. For example, the greater the sizes of the dot pattern opening portions 122 in the lengthwise direction (the direction of $\pm y$), the greater the space dl between the blocking bridges 126.

Meanwhile, the dot pattern opening portions 122 that are adjacent to each other and substantially perpendicular to the lengthwise direction (the direction of $\pm y$) are divided by a plurality of blocking bridges 126 that are disposed in the lengthwise direction (the direction of $\pm y$).

If unit mask strips are extended in a lengthwise direction and are fixed to a frame by forming a unit masking pattern portion including all stripe pattern opening portions, blocking ribs between the stripe pattern opening portions may be attached to or detached from each other due to a stress applied substantially perpendicularly to the lengthwise direction. Meanwhile, if unit mask strips are extended in a lengthwise direction and are fixed to a frame by forming a unit masking pattern portion including all dot pattern opening portions, the unit masking pattern portion may be seriously deformed, such as wrinkling of the unit masking pattern portion, due to stress applied substantially perpendicularly to the lengthwise direction.

However, in the unit masking pattern portion 120 according to the present embodiment, the stripe pattern opening portions 121 and the dot pattern opening portions 122 are alternately formed in the lengthwise direction (the direction of ±y) of the unit mask strips 110, thereby preventing the blocking ribs 127 from being separated from each other, and preventing the unit masking pattern portion 120 from wrinkling.

Figure 3:
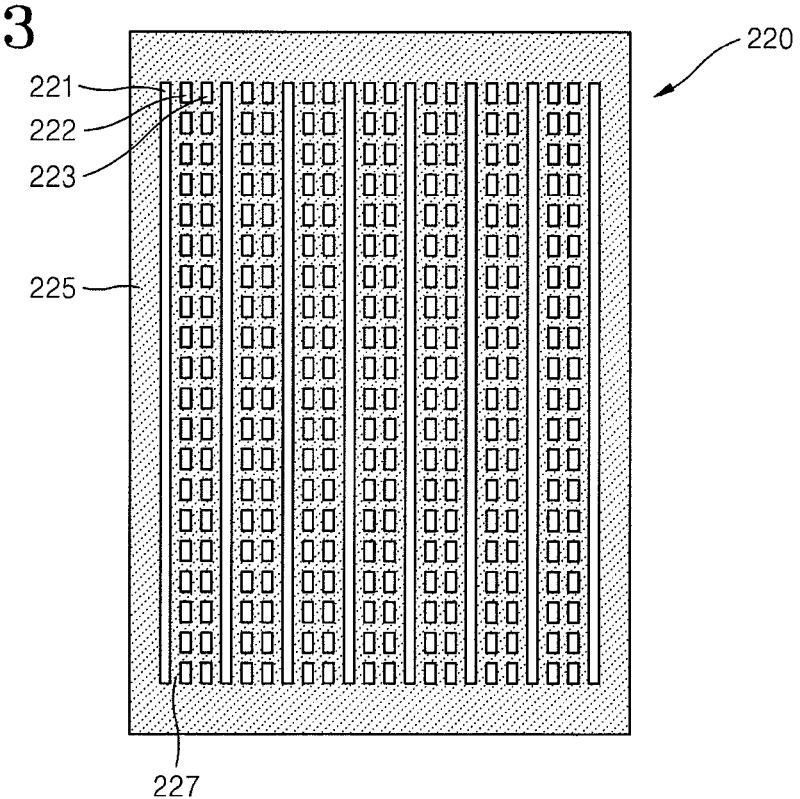
FIG. 3 is a schematic top view illustrating a unit masking pattern portion included in a mask frame assembly for thin film deposition, according to another embodiment.

FIG. 3 is a schematic top view illustrating a unit masking pattern portion 220 included in a mask frame assembly for thin film deposition, according to another embodiment.

Referring to FIG. 3, the unit masking pattern portion 220 according to the present embodiment includes i) a plurality of stripe pattern opening portions 221 that are disposed in substantially parallel with the lengthwise direction (the direction of ±y) of the unit mask strips 110 and ii) a plurality of dual dot pattern opening portions 222 and 223 that are continuously disposed in the lengthwise direction (the direction of ±y) between the stripe pattern opening portions 221. A blocking portion 225 is disposed around the unit masking pattern portion 220.

The stripe pattern opening portions 221 and the dot pattern opening portions 222 and 223 are disposed substantially symmetrically to each other with respect to a central axis of the unit masking pattern portion 220.

Compared to the single dot pattern opening portions 122 of the FIG. 2 embodiment, the FIG. 3 embodiment includes the dual dot pattern opening portions 222 and 223 disposed between the strip pattern opening portions 221. Meanwhile, although the dual dot pattern opening portions 222 and 223 are disposed in the unit masking pattern portion 220, the present invention is not limited thereto and the number of dot pattern opening portions may appropriately increase in such a way that the dual dot pattern opening portions 222 and 223 can prevent the unit masking pattern portion 220 from wrinkling.

Therefore, in the unit masking pattern portion 220 according to the present embodiment, the dual dot pattern opening portions 222 and 223 are disposed and the dual dot pattern opening portions 222 and 223 and the stripe pattern opening portion 221 are disposed substantially symmetrically to each other, thereby preventing blocking ribs 227 from being separated from each other, and preventing the unit masking pattern portion 220 from wrinkling.

Figure 4:
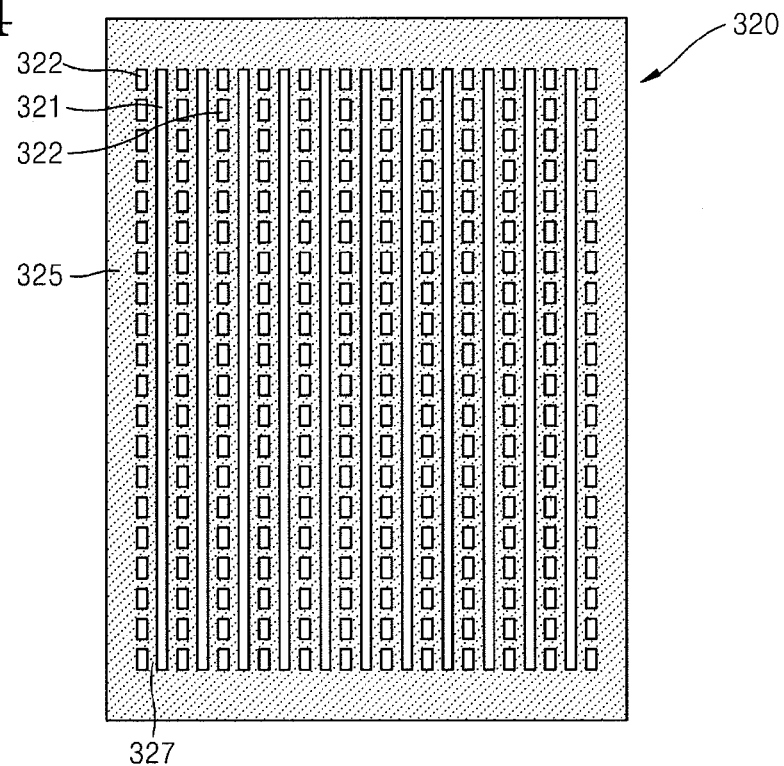
FIG. 4 is a schematic top view illustrating a unit masking pattern portion included in a mask frame assembly for thin film deposition, according to another embodiment of the present invention.

FIG. 4 is a schematic top view illustrating a unit masking pattern portion included in a mask frame assembly for thin film deposition, according to another embodiment. A blocking portion 325 is disposed around the unit masking pattern portion 320.

In comparison with the unit masking pattern portion 120 described with reference to FIG. 2, referring to FIG. 4, a plurality of dot pattern opening portions 322 are disposed in both ends of a unit masking pattern portion 320 in the lengthwise direction (the direction of ±y) and a plurality of stripe pattern opening portions 321 are alternately disposed between the dot pattern opening portions 322. In the FIG. 4 embodiment, the dot pattern opening portions 322 are disposed in both ends of the unit masking pattern portion 320, the stripe pattern opening portions 321 are alternately disposed between the dot pattern opening portions 322. Further, the dot pattern opening portions 322 and the stripe pattern opening portions 321 are disposed substantially symmetrically to each other, thereby preventing blocking ribs 327 from being separated from each other, and preventing the unit masking pattern portion 320 from wrinkling.

Figure 5:
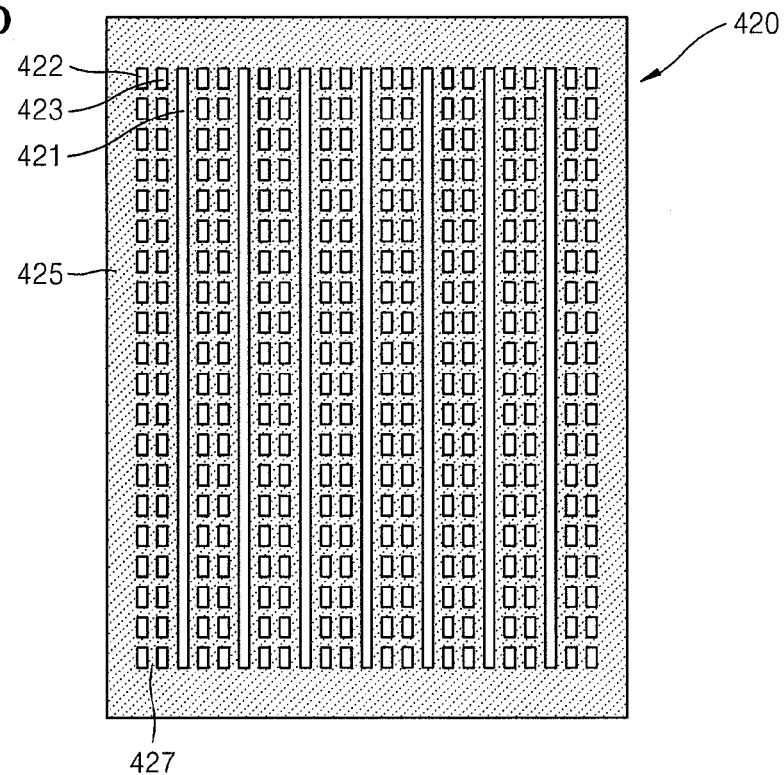
FIG. 5 is a schematic top view illustrating a unit masking pattern portion included in a mask frame assembly for thin film deposition, according to another embodiment.

FIG. 5 is a schematic top view illustrating a unit masking pattern portion 420 included in a mask frame assembly for thin film deposition, according to another embodiment. A blocking portion 425 is disposed around the unit masking pattern portion 420.

Compared to the FIG. 4 embodiment, the FIG. 5 embodiment includes a plurality of dual dot pattern opening portions 422 and 423 disposed between a plurality of stripe pattern opening portions 421. Meanwhile, although the dual dot pattern opening portions 422 and 423 are disposed in the unit masking pattern portion 420, the present invention is not limited thereto and the number of dot pattern opening portions may appropriately increase in such a way that the dual dot pattern opening portions 422 and 423 can prevent the unit masking pattern portion 420 from wrinkling. In the FIG. 5 embodiment, the dual dot pattern opening portions 422 and 423 are disposed in both ends of the unit masking pattern portion 420 and disposed between the stripe pattern opening portions 421. Further, the dual dot pattern opening portions 422 and 423 and the stripe pattern opening portion 421 are disposed substantially symmetrically to each other, thereby preventing blocking ribs 427 from being separated from each other, and preventing the unit masking pattern portion 420 from wrinkling.

Figure 6:
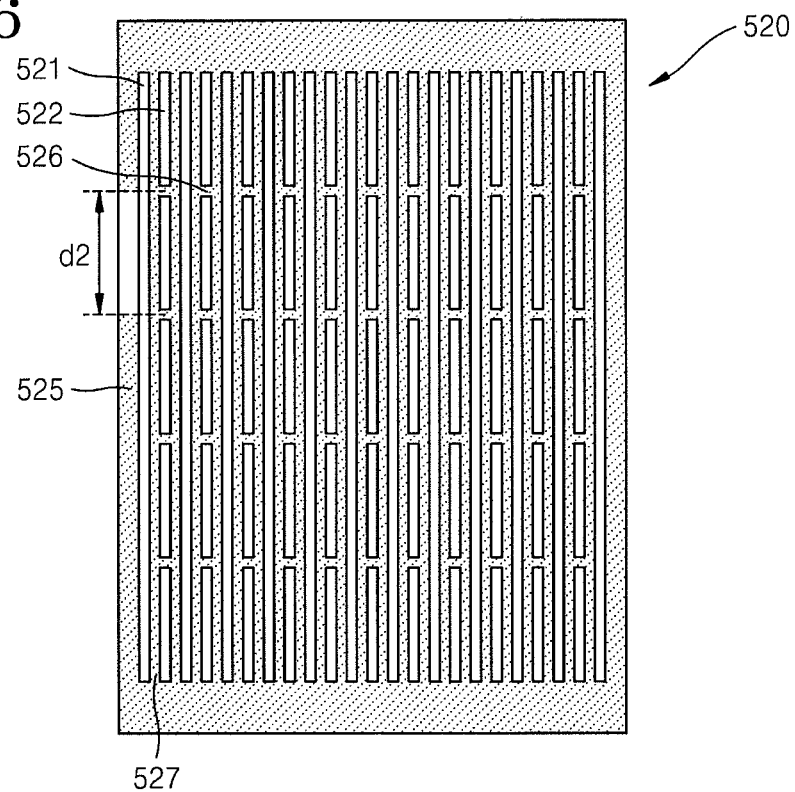
FIG. 6 is a schematic top view illustrating a unit masking pattern portion included in a mask frame assembly for thin film deposition, according to another embodiment.

FIG. 6 is a schematic top view illustrating a unit masking pattern portion 520 included in a mask frame assembly for thin film deposition, according to another embodiment.

Referring to FIG. 6, the unit masking pattern portion 520 includes a plurality of stripe pattern opening portions 521 that are disposed in substantially parallel with the lengthwise direction (the direction of ±y) of the unit mask strips 110 and a plurality of dot pattern opening portions 522 that are continuously disposed in the lengthwise direction (the direction of ±y) between the stripe pattern opening portions 521. A blocking portion 525 is disposed around the unit masking pattern portion 520. The stripe pattern opening portions 521 and the dot pattern opening portions 522 are disposed substantially symmetrically to each other with respect to a central axis of the unit masking pattern portion 520.

The dot pattern opening portions 522 that are adjacent to each other in the lengthwise direction (the direction of ±y) are divided by a plurality of blocking bridges 526 that are disposed substantially perpendicularly to the lengthwise direction (the direction of ±y). A space d2 between the blocking bridges 526 remains substantially constant. The dot pattern opening portions 522 that are adjacent to each other (in the direction of ±x) substantially perpendicular to the lengthwise direction (the direction of ±y) are divided by a plurality of blocking bridges 527 that are disposed in the lengthwise direction (the direction of ±y).

In one embodiment, the space d2 between the blocking bridges 526 is related to sizes of the dot pattern opening portions 522 in the lengthwise direction. For example, the sizes of the dot pattern opening portions 522 in the lengthwise direction (the direction of ±y) are greater than those of the dot pattern opening portions 122, 222, 322, and 422. However, if the sizes of the dot pattern opening portions 522 in the lengthwise direction (the direction of ±y) are too great, since the blocking ribs 527 may be attached to or detached from each other, the sizes of the dot pattern opening portions 522 may be determined in an appropriate range in order to prevent the blocking ribs 527 from being attached to or detached from each other.

Therefore, in the unit masking pattern portion 520 according to the present embodiment, the stripe pattern opening portions 521 are disposed in both ends of the unit masking pattern portion 520, the dot pattern opening portions 522 having large sizes are alternately disposed between the stripe pattern opening portions 521 in the lengthwise direction (the direction of ±y), thereby preventing the blocking ribs 527 from being separated from each other, and preventing the unit masking pattern portion 520 from wrinkling.

Figure 7:
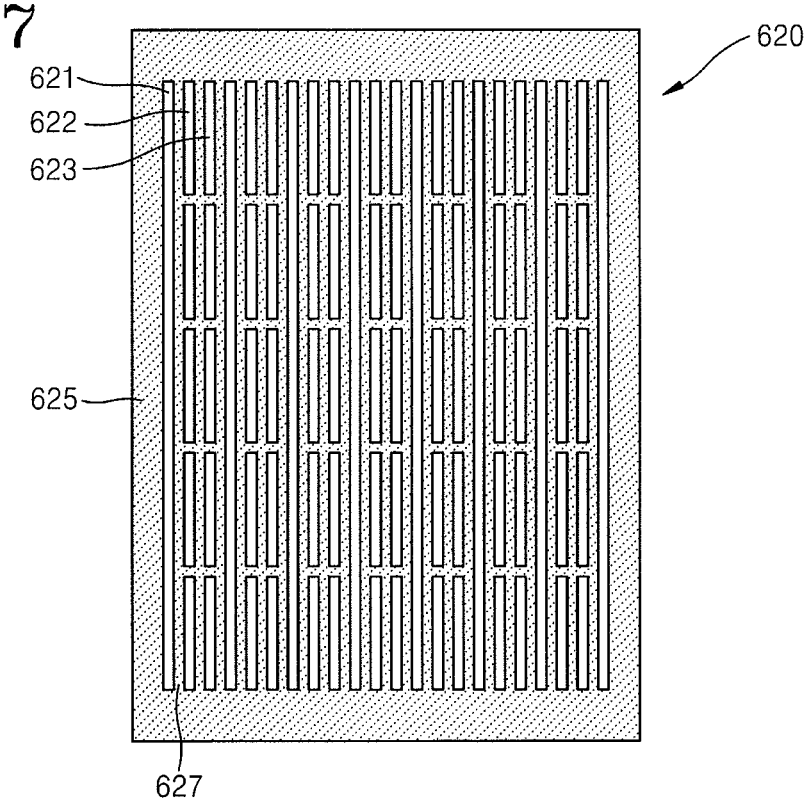
FIG. 7 is a schematic top view illustrating a unit masking pattern portion included in a mask frame assembly for thin film deposition, according to another embodiment.

FIG. 7 is a schematic top view illustrating a unit masking pattern portion 620 included in a mask frame assembly for thin film deposition, according to another embodiment. A blocking portion 625 is disposed around the unit masking pattern portion 620.

Compared to the single dot pattern opening portions 522 of the FIG. 6 embodiment, the FIG. 7 embodiment includes a plurality of dual dot pattern opening portions 622 and 623 disposed between the strip pattern opening portions 621 in the lengthwise direction. Meanwhile, although the dual dot pattern opening portions 622 and 623 are disposed in the unit masking pattern portion 620, the present invention is not limited thereto and the number of dot pattern opening portions may appropriately increase in such a way that the dual dot pattern opening portions 622 and 623 can prevent the unit masking pattern portion 620 from wrinkling.

Figure 8:
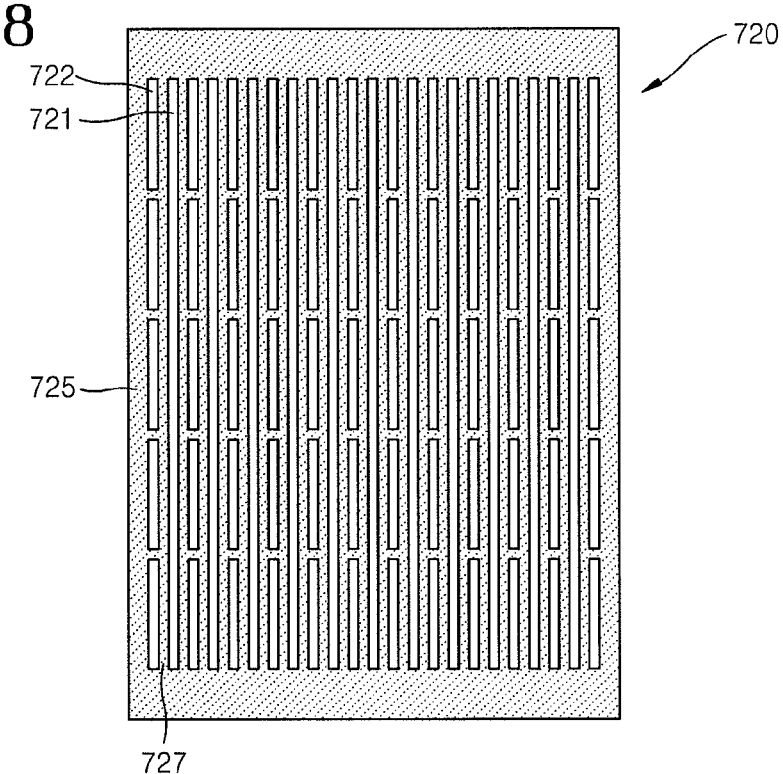
FIG. 8 is a schematic top view illustrating a unit masking pattern portion included in a mask frame assembly for thin film deposition, according to another embodiment.

In the FIG. 7 embodiment, the dual dot pattern opening portions 622, 623 are disposed between the strip pattern opening portions 621 in the lengthwise direction. Further, the dual dot pattern opening portions 622 and 623 and the stripe pattern opening portion 621 are disposed substantially symmetrically to each other, thereby preventing blocking ribs 627 from being separated from each other, and preventing the unit masking pattern portion 620 from wrinkling. FIG. 8 is a schematic top view illustrating a unit masking pattern portion 720 included in a mask frame assembly for thin film deposition, according to another embodiment. A blocking portion 725 is disposed around the unit masking pattern portion 720.

In comparison with the FIG. 6 embodiment, the FIG. 8 embodiment includes i) a plurality of dot pattern opening portions 722 disposed in both ends of the unit masking pattern portion 720 in the lengthwise direction (the direction of ±y) and ii) a plurality of stripe pattern opening portions 721 alternately disposed between the dot pattern opening portions 722.

In the FIG. 8 embodiment, the dot pattern opening portions 722 are disposed in both ends of the unit masking pattern portion 720, the stripe pattern opening portions 721 are alternately disposed between the dot pattern opening portions 722. Further, the dot pattern opening portions 722 and the stripe pattern opening portions 721 are disposed substantially symmetrically to each other, thereby preventing blocking ribs 727 from being separated from each other, and preventing the unit masking pattern portion 720 from wrinkling.

Figure 9:
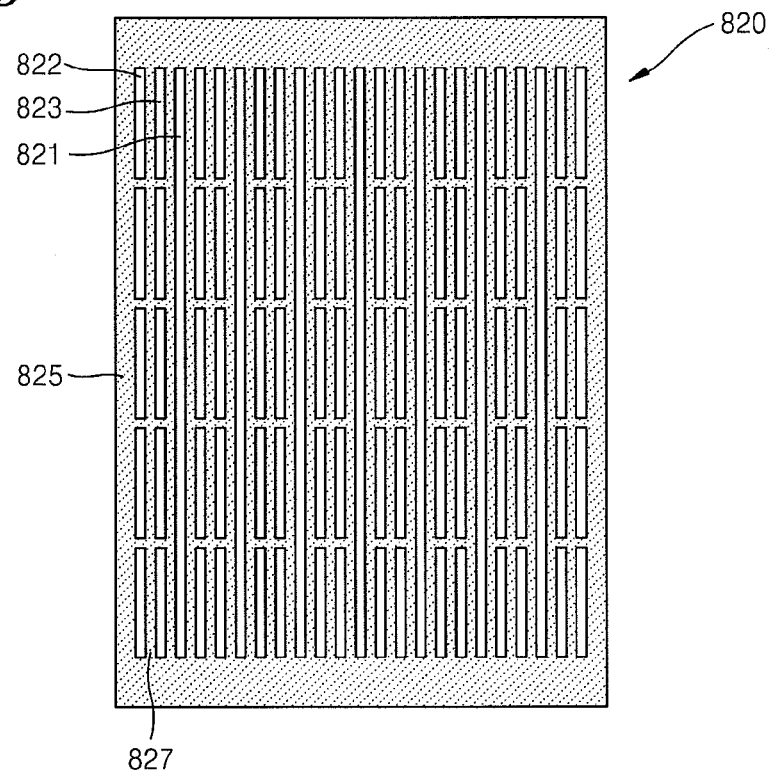
FIG. 9 is a schematic top view illustrating a unit masking pattern portion included in a mask frame assembly for thin film deposition, according to another embodiment.

FIG. 9 is a schematic top view illustrating a unit masking pattern portion 820 included in a mask frame assembly for thin film deposition, according to another embodiment. A blocking portion 825 is disposed around the unit masking pattern portion 820.

Compared to the single the dot pattern opening portions 722 of the FIG. 8 embodiment, the FIG. 9 embodiment includes a plurality of dual dot pattern opening portions 822 and 823 disposed between a plurality of stripe pattern opening portions 821. Meanwhile, although the dual dot pattern opening portions 822 and 823 are disposed in the unit masking pattern portion 820, the present invention is not limited thereto and the number of dot pattern opening portions may appropriately increase in such a way that the dual dot pattern opening portions 822 and 823 can prevent the unit masking pattern portion 820 from wrinkling.

Therefore, in the unit masking pattern portion 820 according to the present embodiment, the dual dot pattern opening portions 822 and 823 are disposed in both ends of the unit masking pattern portion 820 and the dual dot pattern opening portions 822 and 823 are disposed between the stripe pattern opening portion 821. Further, the dual dot pattern opening portions 822 and 823 and the stripe pattern opening portion 821 are disposed substantially symmetrically to each other, thereby preventing blocking ribs 827 from being separated from each other, and preventing the unit masking pattern portion 820 from wrinkling.

Figure 10:
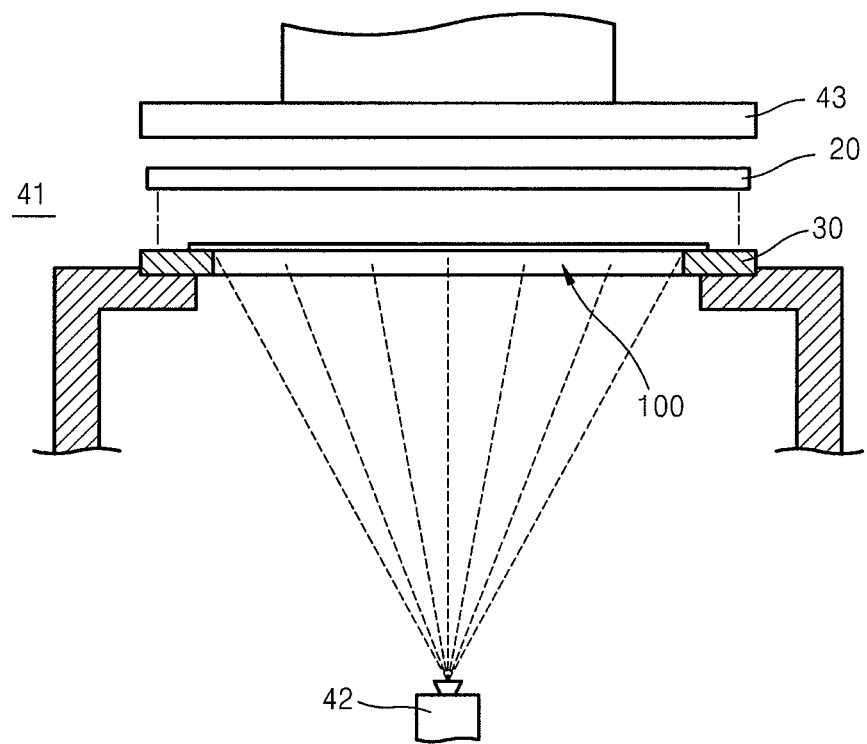
FIG. 10 is a schematic cross-sectional view illustrating a deposition apparatus including a mask frame assembly for thin film deposition, according to an embodiment.

FIG. 10 is a schematic cross-sectional view illustrating a deposition apparatus including a mask frame assembly for thin film deposition, according to an embodiment.

The mask frame assemblies for thin film deposition according to at least one embodiment are deposited in the deposition apparatus shown in FIG. 10 and perform a deposition operation.

Referring to FIG. 10, in order to deposit an intermediate layer of a thin film of an organic light emitting display device using the mask 100, the frame 30, which is coupled to the mask 100, is installed in a side corresponding to a thin film deposition crucible 42 installed in a vacuum chamber 41. Further, an object 20 on which the thin film is to be formed is mounted on the upper portion of the frame 30. The intermediate layer includes a light emitting unit for emitting light, such as red light, green light, and blue light. A magnet unit 43 for adhering the mask 100 supported by the frame 30 to the object 20 on which the thin film is to be formed is driven on the upper portion of the object 20 so that the mask 100 is adhered to the object 20 on which the thin film is to be formed. A material is deposited on the object 20, according to an operation of the thin film deposition crucible 42.

Figure 11:
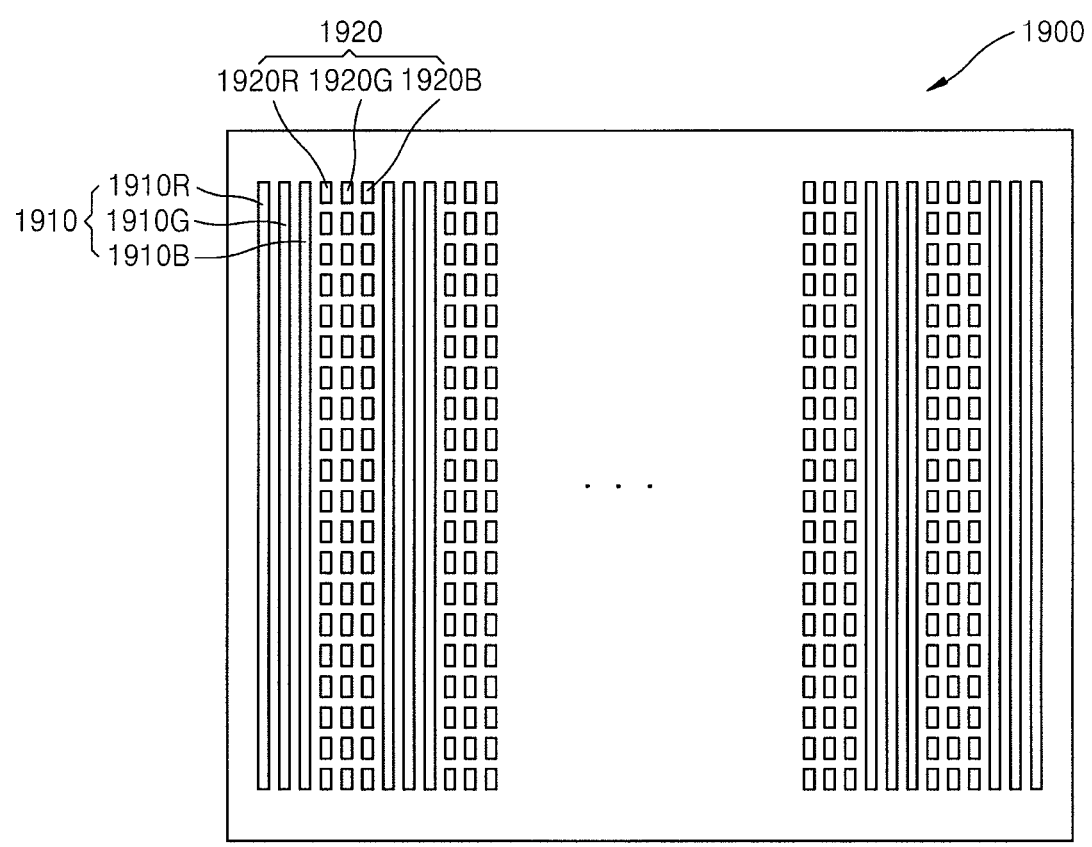
FIG. 11 is a schematic top view of a pixel pattern of an organic light emitting display device in which an intermediate layer is formed using the unit masking pattern portion of FIG. 2, according to an embodiment.

FIG. 11 is a schematic top view of a pixel pattern 1900 of an organic light emitting display device in which an intermediate layer is formed using the unit masking pattern portion of FIG. 2, according to an embodiment.

The organic light emitting display device includes a first electrode and a second electrode that face each other and an intermediate layer including at least a light emitting layer between the first electrode and the second electrode.

When the organic light emitting display device is manufactured using the mask frame assemblies including the unit masking pattern portions of FIGS. 2 through 9, the intermediate layer of the organic light emitting display device includes a plurality of stripe patterns that are continuously disposed in substantially parallel with a first direction and a plurality of dot patterns that are disposed between the stripe patterns and are continuously disposed in substantially parallel with the first direction.

Referring to FIG. 11, when the unit masking pattern portion 120 of FIG. 2 is used to deposit a light emitting layer on the organic light emitting display device, the light emitting layer has the pixel pattern 1900. In both ends of the light emitting layer of the organic light emitting display device, three line consecutive stripe patterns 1920R, 1920G, and 1920B are disposed in substantially parallel with a first direction (the direction of ±y) that is a lengthwise direction of the unit mask stripes, and three line consecutive dot patterns 1910R, 1910G, and 1910B are disposed between the three line consecutive stripe patterns 1920R, 1920G, and 1920B.

The organic light emitting display device includes red, green and blue light emitting layers which are deposited according to different processes. In one embodiment, a mask including opening portions corresponding to patterns of a sub-pixel region that is to emit a red light is used to deposit the red light emitting layer, a mask including opening portions corresponding to patterns of a sub-pixel region that is to emit a green light is used to deposit the green light emitting layer. Further, a mask including opening portions corresponding to patterns of a sub-pixel region that is to emit a blue light is used to deposit the blue light emitting layer. Thus, the pixel pattern 1900 of the light emitting layer shows when the mask frame assembly including the unit masking pattern portion 120 of FIG. 2 is used to deposit the light emitting layer.

If sub-pixels have the pixel pattern 1900, since patterns of a deposition unit masking pattern portion have a high pitch precision, it is possible to realize a very precise pitch between pixels. Thus, a large sized display device has a high pitch precision between pixels, and thus it is possible to realize a high definition display device and prevent yield reduction due to deformation of opening portions of a deposition mask during a deposition process.

Although the pattern 1900 of the light emitting layer shows only when the deposition mask of FIG. 2 is used to deposit the light emitting layer in the present embodiment, the deposition masks of FIGS. 3 through 9 may be used to deposit the light emitting layer, thereby realizing a high definition display device having a high pitch precision between pixels and preventing yield reduction due to deformation of opening portions of a deposition mask during a deposition process.

That is, when the unit masking pattern portion 220 of FIG. 3 is used to deposit the light emitting layer, in both ends of the light emitting layer of the organic light emitting display device, three line consecutive stripe patterns are disposed in substantially parallel with the first direction (the direction of ±y), and six line dot patterns are disposed between the three line consecutive stripe patterns.

When the unit masking pattern portion 320 of FIG. 4 is used to deposit the light emitting layer, in both ends of the light emitting layer of the organic light emitting display device, three line consecutive dot patterns are disposed in substantially parallel with the first direction (the direction of ±y). Further, three line stripe patterns are disposed between the three line consecutive dot patterns.

When the unit masking pattern portion 420 of FIG. 5 is used to deposit the light emitting layer, in both ends of the light emitting layer of the organic light emitting display device, six line consecutive dot patterns are disposed in substantially parallel with the first direction (the direction of ±y), and three line stripe patterns are disposed between the six line consecutive dot patterns.

When the unit masking pattern portion 520 of FIG. 6 is used to deposit the light emitting layer, in both ends of the light emitting layer of the organic light emitting display device, three line consecutive stripe patterns are disposed in substantially parallel with the first direction (the direction of ±y), and three line dot patterns having large sizes in the lengthwise direction are disposed between the three line consecutive dot patterns. Compared to the dot patterns of the light emitting layer of the organic light emitting display device manufactured using the unit masking pattern portion 120 of FIG. 2, the dot patterns of the light emitting layer of the organic light emitting display device manufactured using the unit masking pattern portion 520 of FIG. 6 are greater in the lengthwise direction. For example, if the size of each dot pattern of FIG. 2 corresponds to the size of a single sub-pixel, each dot pattern of FIG. 2 corresponds to at least four sub-pixels in the lengthwise direction with reference to FIG. 6.

When the unit masking pattern portion 620 of FIG. 7 is used to deposit the light emitting layer, in both ends of the light emitting layer of the organic light emitting display device, three line consecutive stripe patterns are disposed in substantially parallel with the first direction (the direction of ±y), and six line dot patterns having large sizes in the lengthwise direction are disposed between the three line consecutive dot patterns.

When the unit masking pattern portion 720 of FIG. 8 is used to deposit the light emitting layer, in both ends of the light emitting layer of the organic light emitting display device, three line dot patterns having large sizes in the lengthwise direction are disposed in substantially parallel with the first direction (the direction of ±y), and three line stripe patterns are disposed between the three line consecutive dot patterns.

When the unit masking pattern portion 820 of FIG. 9 is used to deposit the light emitting layer, in both ends of the light emitting layer of the organic light emitting display device, six line dot patterns having large sizes in the lengthwise direction are disposed in substantially parallel with the first direction (the direction of ±y), and three line stripe patterns are disposed between the six line consecutive dot patterns.

The organic light emitting display device may include passive matrix sub-pixels or active matrix sub-pixels.

Figure 12:
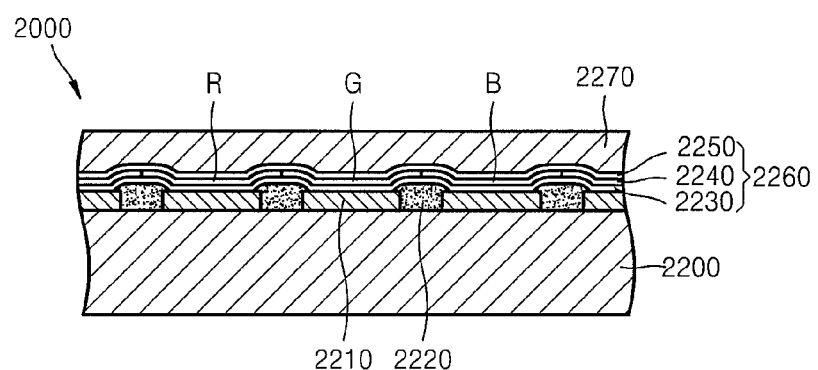
FIG. 12 is a schematic cross-sectional view of a passive matrix organic light emitting display device, according to an embodiment.

FIG. 12 is a schematic cross-sectional view of a passive matrix organic light emitting display device, according to an embodiment.

Referring to FIG. 12, a first electrode layer 2210 is formed on a substrate 2200 in a stripe pattern. An intermediate layer 2260 including a light emitting layer 2240 and a second electrode layer 2270 are sequentially formed on the first electrode layer 2210. The intermediate layer 2260 further includes layers 2230 and 2250. An insulation layer 2220 may be further disposed between lines of the first electrode layer 2210. The second electrode layer 2270 may be formed in a pattern that is substantially perpendicular to a pattern of the first electrode layer 2210.

The light emitting layer 2240 of the intermediate layer 2260 includes red R, green G, and blue B light emitting layers to create full color images, which may be formed using the masks including the unit masking pattern portions of FIGS. 2 through 9.

In one embodiment, the first electrode layer 2210 functions as an anode electrode, and the second electrode layer 2270 functions as a cathode electrode. The first and second electrode layers 2210 and 2270 may function as cathode and anode electrodes, respectively.

Figure 13:
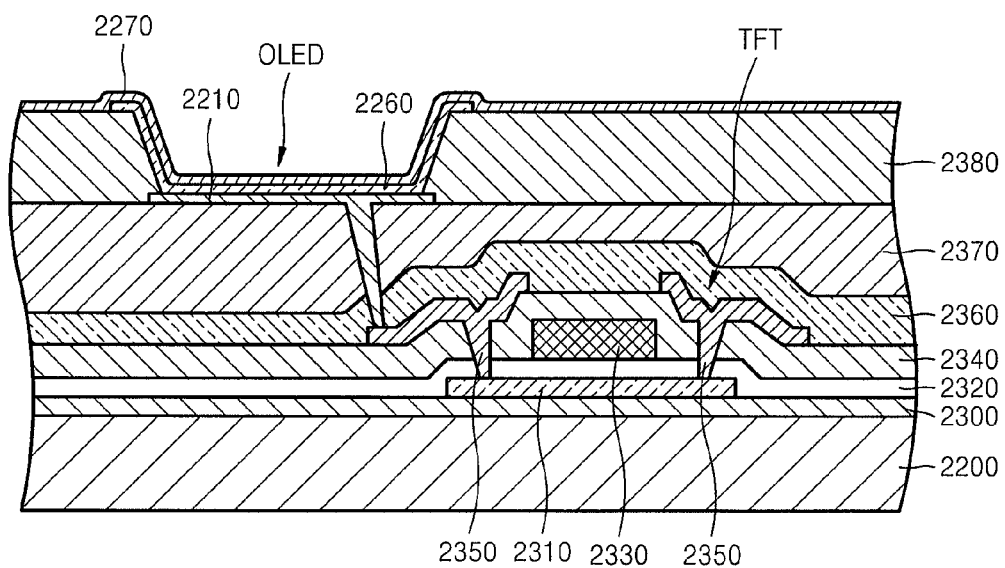
FIG. 13 is a schematic cross-sectional view of an active matrix organic light emitting display device, according to an embodiment.

FIG. 13 is a schematic cross-sectional view of an active matrix organic light emitting display device, according to an embodiment.

Referring to FIG. 13, the organic light emitting display device may be an active matrix (AM), and a subpixel thereof is illustrated. The subpixel may include at least one thin film transistor (TFT) and an organic light emitting diode (OLED) that is a self-emissive device. However, the subpixel is not limited to the structure illustrated in FIG. 13, and the number and structure of the TFTs may be modified in various ways. The active matrix organic light emitting display device of FIG. 13 will now be explained in detail.

A buffer layer 2300 formed of, for example, $S_iO_2$, $S_iN_x$, etc. may be disposed on a substrate 2200, and a TFT may be disposed on the buffer layer 2300.

The TFT may include a semiconductor active layer 2310 formed on the buffer layer 2300, a gate insulating layer 2320 covering the active layer 2310 and a gate electrode 2330 on the gate insulating layer 2320. An interlayer insulating layer 2340 may cover the gate electrode 2330, and source and drain electrodes 2350 may be disposed on the interlayer insulating layer 2340. The source and drain electrodes 2350 may respectively contact a source region and a drain region of the semiconductor active layer 2310 through contact holes in the interlayer insulating layer 2340 and the gate insulating layer 2320. The semiconductor active layer 2310 may be formed of an inorganic semiconductor or an organic semiconductor.

A passivation layer 2360 formed of, for example, $S_iO_2$, $S_iN_x$, etc. may be formed on the source and drain electrodes 2350. A planarization layer 2370 formed of, for example, acryl, polyimide, etc. may be formed on the passivation layer 2360. Although not shown, the TFT may be connected to at least one capacitor.

Meanwhile, the source and drain electrodes 2350 may be connected to the OLED. The source and drain electrodes 2350 may be connected to a first electrode layer 2210 that is an anode of the OLED. The first electrode layer 2210 may be disposed on the planarization layer 2370, and a pixel defining layer 2380 may cover the first electrode layer 2210. After a predetermined opening is formed in the pixel defining layer 2380, the OLED may be formed.

The OLED emits red, green, and blue light according to a current flow and displays predetermined image information. The OLED includes the first electrode layer 2210 that is connected to the source and drain electrodes 2350 of the TFT and is supplied positive power therefrom, the second electrode layer 2270 that covers whole pixels and is supplied negative power therefrom, and the intermediate layer 2260 that is disposed between the first electrode layer 2210 and the second layer 2270 and emits light.

The active matrix (AM) organic light emitting display device of the present embodiment may use the deposition masks of FIGS. 2 through 9 to form an organic light emitting layer of the intermediate layer 2260 by using various patterning processes, thereby realizing a high precision display device.

According to at least one embodiment, a mask capable of reducing deformation of an opening portion pattern can be manufactured. Further, the mask can be used to manufacture a high precision organic light emitting display device. Moreover, the mask can be used to manufacture a large area organic light emitting display device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A mask frame assembly for thin film deposition comprising:
   a frame, wherein an opening is defined in the frame; and
   a plurality of unit mask strips which extend in a first direction to be substantially parallel with each other and attached to the frame such that the unit mask strips cross the opening of the frame,
   wherein each of the unit mask strips comprises a plurality of unit masking patterns which are spaced apart from each other and extend in a second direction substantially perpendicular to the first direction, wherein each of the unit masking patterns comprises: i) a plurality of stripe pattern slits each of which extends in the second direction and ii) a plurality of sets of dot pattern slits each set formed to be substantially parallel with the stripe pattern slits, wherein the stripe pattern slits and the sets of dot pattern slits are alternately formed with respect to each other,
   wherein each set of the dot pattern slits comprises a plurality of dot pattern slits, wherein the length of each stripe pattern slit is substantially the same as the length of each set of the dot pattern slits, wherein at least one of the stripe pattern slits is disposed in the leftmost and rightmost ends of each unit masking pattern, wherein the at least one stripe pattern slit is continuously formed, and wherein more than two sets of the dot pattern slits are formed between adjacent stripe pattern slits.

2. The mask frame assembly for thin film deposition of claim 1, wherein the stripe pattern slits and the sets of dot pattern slits are formed to be substantially symmetrical to each other with respect to a central axis of the unit masking patterns, and wherein the central axis is substantially parallel with the second direction.

3. The mask frame assembly for thin film deposition of claim 1, wherein the dot pattern slits of each set are substantially evenly spaced apart from each other.

4. The mask frame assembly for thin film deposition of claim 1, wherein the dot pattern slits of each set are divided by a plurality of blocking bridges, and wherein the blocking bridges have substantially the same length.

5. The mask frame assembly for thin film deposition of claim 1, wherein the unit mask stripes are formed of nickel or a nickel alloy.

6. The mask frame assembly for thin film deposition of claim 1, wherein each of the unit mask stripes further comprises a blocking portion which surrounds the unit masking patterns.

7. A mask frame assembly for thin film deposition comprising:
   a mask frame, wherein an opening is defined in the mask frame; and
   a plurality of unit mask strips which extend in a first direction to be substantially parallel with each other and cross the opening of the mask frame,
   wherein each of the unit mask strips comprises a plurality of unit masking patterns which are spaced apart from each other and extend in a second direction substantially perpendicular to the first direction,
   wherein each of the unit masking patterns comprises: i) a plurality of stripe pattern slits each of which extends in the second direction and ii) a plurality of sets of dot pattern slits each set formed to be substantially parallel with the stripe pattern slits, wherein the stripe pattern slits and the sets of dot pattern slits are alternately formed with respect to each other,
   wherein each set of the dot pattern slits comprises a plurality of dot pattern slits, wherein the length of each stripe pattern slit is substantially the same as the length of each set of the dot pattern slits, wherein all of the unit masking patterns have substantially the same slit arrangement, wherein at least one of the stripe pattern slits is disposed in the leftmost and rightmost ends of each unit masking pattern, wherein the at least one stripe pattern slit is continuously formed and wherein more than two sets of the dot pattern slits are formed between adjacent stripe pattern slits.

8. The mask frame assembly for thin film deposition of claim 7, wherein the stripe pattern slits and the sets of dot pattern slits are formed to be substantially symmetrical to each other with respect to a central axis of the unit masking patterns, and wherein the central axis is substantially parallel with the second direction.

* * * * *